United States Patent
Shimizu

(10) Patent No.: US 9,261,547 B2
(45) Date of Patent: Feb. 16, 2016

(54) ELECTROSTATIC CAPACITANCE DETECTION DEVICE

(71) Applicant: KABUSHIKI KAISHA TOKAI RIKA DENKI SEISAKUSHO, Aichi (JP)

(72) Inventor: Tomomi Shimizu, Aichi (JP)

(73) Assignee: KABUSHIKI KAISHA TOKAI RIKA DENKI SEISAKUSHO, Aichi (JP)

(*) Notice: Subject to any disclaimer, the term of this patent is extended or adjusted under 35 U.S.C. 154(b) by 73 days.

(21) Appl. No.: 13/892,505

(22) Filed: May 13, 2013

(65) Prior Publication Data

US 2013/0342220 A1    Dec. 26, 2013

(30) Foreign Application Priority Data

Jun. 22, 2012   (JP) .................... 2012-141295

(51) Int. Cl.
*G01R 27/26* (2006.01)
*G01R 31/28* (2006.01)
*H03K 17/96* (2006.01)

(52) U.S. Cl.
CPC ........ *G01R 27/2605* (2013.01); *G01R 31/2829* (2013.01); *H03K 17/9622* (2013.01); *H03K 2217/960705* (2013.01)

(58) Field of Classification Search
CPC .......... G01R 27/2605; G01R 31/2829; H03K 17/9622
USPC ......... 324/600, 658–661, 500, 519, 512, 679, 324/670, 690, 548; 345/173–178
See application file for complete search history.

(56) References Cited

U.S. PATENT DOCUMENTS

| | | | |
|---|---|---|---|
| 2007/0279446 A1* | 12/2007 | Ishizaki | 347/19 |
| 2010/0160737 A1* | 6/2010 | Shachar et al. | 600/202 |
| 2010/0188347 A1* | 7/2010 | Mizuhashi et al. | 345/173 |
| 2011/0109275 A1* | 5/2011 | Taniguchi | 320/145 |
| 2011/0140720 A1* | 6/2011 | Kurashima | 324/686 |

FOREIGN PATENT DOCUMENTS

| | | |
|---|---|---|
| JP | H7218573 A | 8/1995 |
| JP | 2008-112334 A | 5/2008 |

(Continued)

OTHER PUBLICATIONS

Chinese Office Action for application No. 201310174329.5 dated Aug. 26, 2015.

(Continued)

*Primary Examiner* — Melissa Koval
*Assistant Examiner* — Trung Nguyen
(74) *Attorney, Agent, or Firm* — Roberts Mlotkowski Safran & Cole, PC

(57) ABSTRACT

An electrostatic capacitance detection device includes a plurality of electrodes configured to detect an electrostatic capacitance, an electrostatic capacitance measurement part configured to select one electrode from the plurality of electrodes as a detection electrode, to allow the electrodes other than the detection electrode to be in a first electric potential condition and then to be in a second electric potential condition that is different from the first electric potential condition, and to measure a first voltage of the detection electrode in the first electric potential condition and a second voltage of the detection electrode in the second electric potential condition, and a judgment part configured to compare measurement values based on the first and the second voltages of the detection electrode, thereby to judge whether the detection electrode is in a short circuit condition.

5 Claims, 4 Drawing Sheets

(56) References Cited

FOREIGN PATENT DOCUMENTS

| | | | |
|---|---|---|---|
| JP | 2008203077 | A | 9/2008 |
| TW | 201142681 | A1 | 12/2011 |
| WO | 2011121862 | | 12/2010 |

OTHER PUBLICATIONS

Jp Office Action dated Feb. 24, 2015 and partial English translation of Reasons for Rejection.
Japanese Office Action Application No. 2012141295 dated Jul. 21, 2015.

* cited by examiner

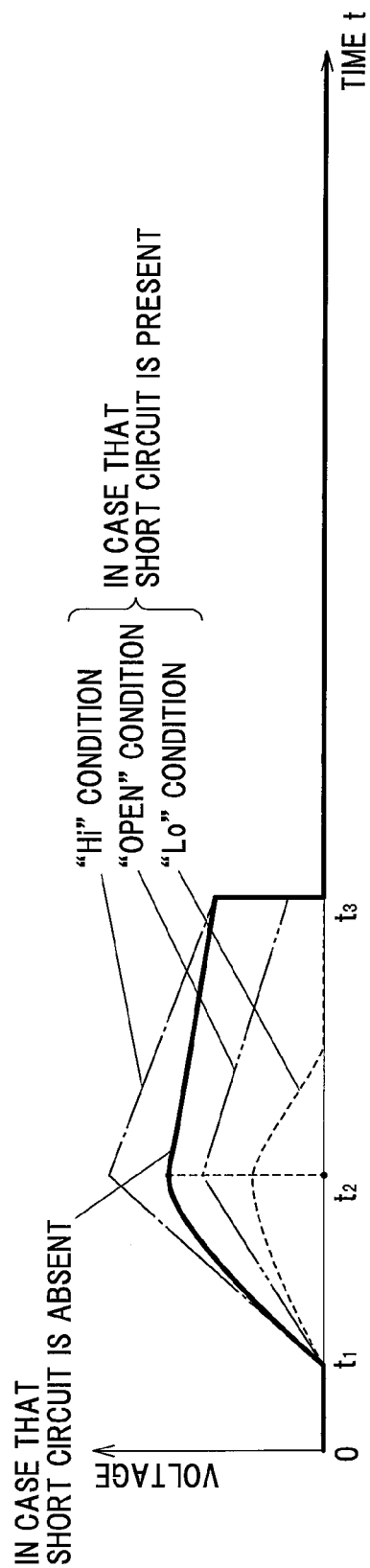

ELECTROSTATIC CAPACITANCE DETECTION DEVICE

The present application is based on Japanese patent application No. 2012-141295 filed on Jun. 22, 2012, the entire contents of which are incorporated herein by reference.

BACKGROUND OF THE INVENTION

1. Field of the Invention

This invention relates to an electrostatic capacitance detection device.

2. Description of the Related Art

As a conventional technique, in a touch switch device that adopts an input method of an electrostatic capacitance type, an electrostatic capacitance detection device is known that is capable of realizing reduction of malfunction caused in case that water is poured over a surface of panel so as to form droplets without using particular structures or circuits (e.g., refer to JP-A-2008-112334).

The electrostatic capacitance detection device is configured such that data such as a time from On to Off of the switch, a duration time of ON as pattern data of ON and Off of switch operation are preliminarily stored in the control program. A case that droplets are present on the switch electrode is simulated, and the following judgment is carried out. In case of being switched from ON to OFF, the present timer value is read out and the timer value recorded is deducted therefrom, thereby the time during which ON has been maintained is calculated. In case that the calculation time is not more than 100 msec, the matter judged as ON shall be void. In addition, in case of remaining ON, the present timer value is read out and the timer value recorded is deducted therefrom, thereby the time during which ON continues is calculated. In case that the calculation time is not less than 500 msec, ON condition that continues in the present situation shall be void until being judged as OFF. As mentioned above, the conventional technique, for example, JP-A-2008-112334 discloses that unnecessary ON can be excluded and reduction of malfunction due to adherence of droplets can be realized by judging the length of ON time of each switch electrode and ON of a plurality of switch electrodes in the processing of the control program.

SUMMARY OF THE INVENTION

The electrostatic capacitance detection device disclosed in JP-A-2008-112334 has a problem that additional configuration to usual detection processing of electrostatic capacitance is needed, and additional processing time is also needed.

Accordingly, it is an object of the invention to provide an electrostatic capacitance detection device that is capable of detecting a short circuit without changing usual detection processing of electrostatic capacitance and increasing processing time.

(1) According to one embodiment of the invention, an electrostatic capacitance detection device comprises:

a plurality of electrodes configured to detect an electrostatic capacitance;

an electrostatic capacitance measurement part configured to select one electrode from the plurality of electrodes as a detection electrode, to allow the electrodes other than the detection electrode to be in a first electric potential condition and then to be in a second electric potential condition that is different from the first electric potential condition, and to measure a first voltage of the detection electrode in the first electric potential condition and a second voltage of the detection electrode in the second electric potential condition; and a judgment part configured to compare measurement values based on the first and the second voltages of the detection electrode, thereby to judge whether the detection electrode is in a short circuit condition.

In the above embodiment (1) of the invention, the following modifications and changes can be made.

(i) The first electric potential condition is one of Open, Lo and Hi, and the second electric potential condition is one of Open condition, Lo condition and Hi condition and is different from the first electric potential condition.

(ii) The electrostatic capacitance measurement part measures more than once the first and second voltages of the detection electrode in the first and the second electric potential conditions.

(iii) The electrostatic capacitance measurement part is configured to sequentially perform a first loop measurement with respect to all of the plurality of electrodes, the first loop measurement comprising:

selecting one of the plurality of electrodes as the detection electrode;

rendering the plurality of electrodes except for the selected detection electrode in the first electric potential condition; and measuring the first voltage of the selected detection electrode in the first electric potential condition.

(iv) The electrostatic capacitance measurement part is configured to, after the first loop measurement, sequentially perform a second loop measurement with respect to all of the plurality of electrodes, the second loop measurement comprising:

selecting one of the plurality of electrodes as the detection electrode;

rendering the plurality of electrodes except for the selected detection electrode in the second electric potential condition; and measuring the second voltage of the selected detection electrode in the second electric potential condition.

(v) The judgment part configured to compare, with respect to all of the plurality of electrodes, a first measurement value based on the first voltage measured at the first loop measurement and a second measurement value based on the second voltage measured at the first loop measurement, thereby to judge whether the selected detection electrode is in the short circuit condition.

(vi) The judgment part judges that the selected detection electrode is in the shot circuit condition when a difference between the first measurement value and the second measurement value is beyond a predetermined threshold value.

POINTS OF THE INVENTION

According to one embodiment of the invention, an electrostatic capacitance detection device is constructed such that a judgment part is configured to sequentially compare, with respect to all detection electrodes, the measurement value based on the voltage of the detection electrodes in the first and the second electric potential conditions. If the difference between the measurement value $C_{n1}$ based on the voltage of the detection electrode $EL_n$ in the first electric potential condition and the measurement value $C_{n2}$ based on the voltage of the detection electrode $EL_n$ in the second electric potential condition is beyond a predetermined threshold value, it can be judged that the electrodes $EL_1$ to $EL_9$ or the connector terminals 41 is in a short circuit.

BRIEF DESCRIPTION OF THE DRAWINGS

The preferred embodiments according to the invention will be explained below referring to the drawings, wherein:

FIG. 4 is a graph showing a difference in the detection voltage between a case that a short circuit is present and a case that the short circuit is absent.

DETAILED DESCRIPTION OF THE PREFERRED EMBODIMENTS

Configuration of Electrostatic Capacitance Detection Device

Figure 1:
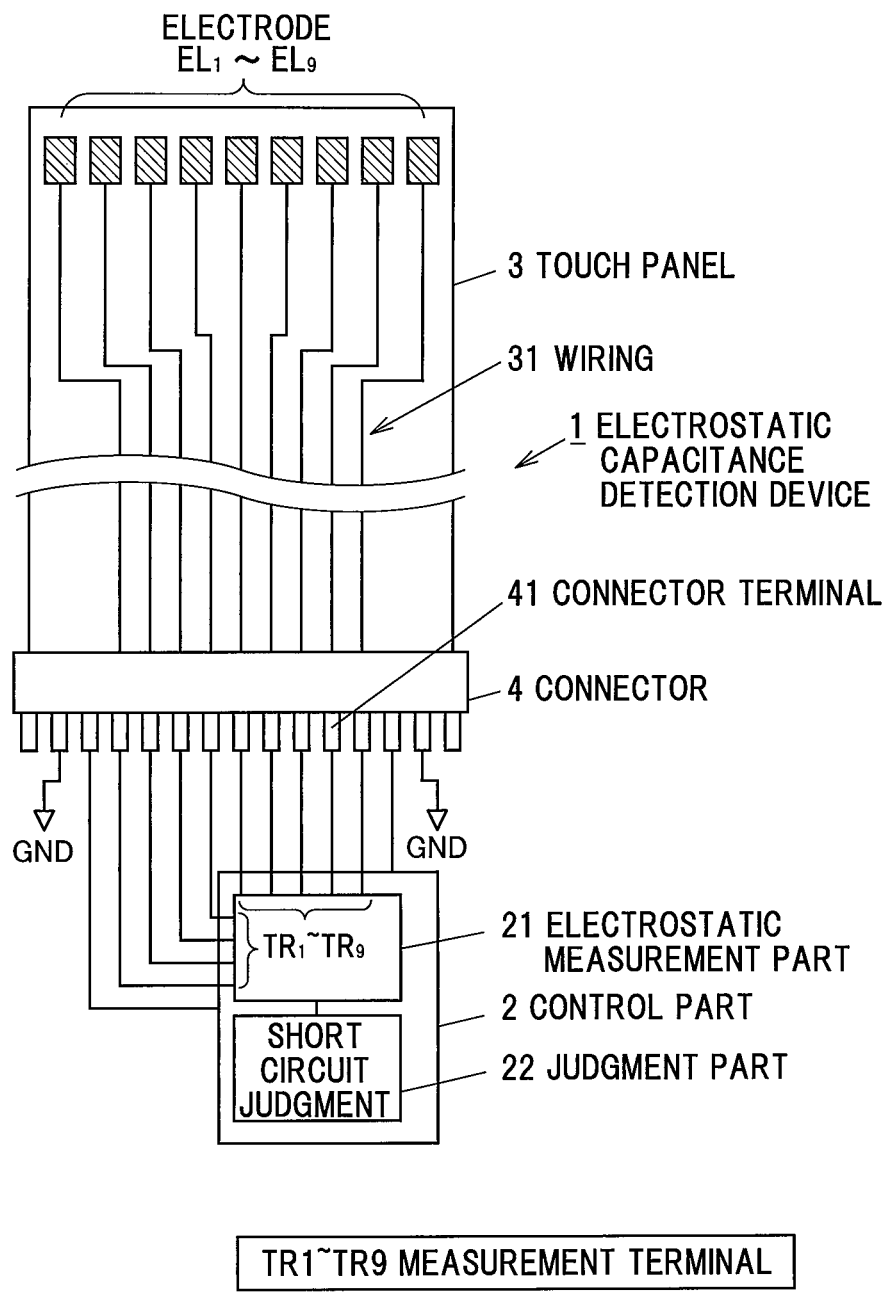
FIG. 1 is an explanatory view schematically showing one example of a configuration of an electrostatic capacitance detection device according to an embodiment of the invention.

FIG. 1 is an explanatory view schematically showing one example of a configuration of an electrostatic capacitance detection device according to an embodiment of the invention. The electrostatic capacitance detection device 1 according to the embodiment of the invention is configured to include a plurality of electrodes $EL_1$ to $EL_9$ configured to detect electrostatic capacitance, an electrostatic capacitance measurement part 21 configured to select one electrode from the electrodes $EL_1$ to $EL_9$ as a detection electrode $EL_n$, and to allow electrodes other than the detection electrode $EL_n$ to be a first electric potential or to be a second electric potential that is different from the first electric potential condition so as to measure the voltage of the detection electrode $EL_n$ at the time of the first electric potential condition and the voltage of the detection electrode $EL_n$ at the time of the second electric potential condition and a judgment part 22 configured to compare the measurement values based on the respective voltages of the detection electrode $EL_n$ at the time of the first and the second electric potential conditions, thereby to judge a short circuit condition between the electrodes. Here, n is an integer from 1 to 9. Further, in the embodiment, the number of the electrode is configured to be 9, but not limited to this, if the number is not less than 2, the plurality of electrodes of not less than 2 are applicable.

Here, the first electric potential condition is any one of Open condition, Lo condition (i.e., a low potential) and Hi condition (i.e., a high potential). In addition, the second electric potential condition is any one of Open condition (i.e., an open-circuit potential), Lo condition and Hi condition and is different from the first electric potential condition in the condition type. Therefore, if the first electric potential condition is Open condition, the second electric potential condition is any one of Lo condition and Hi condition. In addition, if the first electric potential condition is Lo condition, the second electric potential condition is any one of Open condition and Hi condition. Furthermore, if the first electric potential condition is Hi condition, the second electric potential condition is any one of Open condition and Lo condition.

As shown in FIG. 1, the electrodes $EL_1$ to $EL_9$ are formed as an electrically conductive pattern on the touch panel 3 formed of a flexible substrate or the like. The electrodes $EL_1$ to $EL_9$ are connected to the control part 2 via the wiring 31, the connector 4 and the connector terminal 41 on the touch panel 3.

Further, the electrodes $EL_1$ to $EL_9$ are configured such that the conductive surface of the front surface thereof is exposed for the purpose of easily carrying out a touch detection due to a finger or the like. In addition, a cover comprised of a resin or the like can be disposed on the front surface thereof to the extent that a difficulty in the touch detection is not brought. On the other hand, the wiring 31 is covered with a thick dielectric material such as a resin or the like in order to prevent a short circuit, and a contact of a finger or the like and an exterior member.

In addition, the connector 4 is configured such that the connector terminals 41 are arranged at a predetermined pitch. Namely, the electrodes $EL_1$ to $EL_9$ are arranged with each other at the pitch or the distance of the extent that makes it possible to carry out the touch operation by a finger or the like, but the connector terminals 41 are arranged at the pitch narrower than that of the electrodes. The pitch is, for example, 2.54 mm, 1.27 mm, 0.8 mm, 0.5 mm and the like.

The electrostatic capacitance detection device 1 includes the control part 2 configured to carry out the detection of electrostatic capacitance, the judgment of short circuit and the like. The control part 2 is configured to include the electrostatic measurement part 21 configured to measure voltages corresponding to electrostatic capacitances in case that the electrodes $EL_1$ to $EL_9$ are touched by a finger or the like, and the judgment part 22 configured to judge a short circuit between the electrodes $EL_1$ to $EL_9$ or a short circuit between the connector terminals 41 based on the measurement result in the electrostatic measurement part 21. In addition, the control part 2 includes a charging part configured to charge the respective electrodes $EL_1$ to $EL_9$ when the electrostatic capacitance of the respective electrodes $EL_1$ to $EL_9$ is measured, a processing control part (CPU) configured to execute these measurement and judgment in accordance with a predetermined program, a counter part configured to count a measurement number of a predetermined number of times, an interface part configured to carry out data input from and data output to the outside, the parts being not shown.

As shown in FIG. 1, the electrostatic measurement part 21 is configured to include measurement terminals $TR_1$ to $TR_9$ respectively connected to the electrodes $EL_1$ to $EL_9$ are connected as an input. The measurement terminals $TR_1$ to $TR_9$ are connected to a selection circuit such as a switch circuit, a multiplexer in the inner circuit of the electrostatic measurement part 21. In addition, the terminals selected by the selection circuit are respectively connected to a voltage measurement part, a first electric potential and a second electric potential.

The first electric potential condition is any one of Lo condition (ground level: 0 V or the like) and Hi condition (5 V, 12 V or the like). In addition, the first electric potential condition can be also Open condition that is a condition not connected to a predetermined electric potential. In addition, similarly, the second electric potential condition is also any one of Lo condition, Hi condition and Open condition. Further, the second electric potential condition is different from the first electric potential condition in the condition type. This makes it possible to provide a different influence for the measurement value in the electric potential detection of the detection electrode $EL_n$, and this makes it easy or possible to judge the presence or absence of short circuit between the electrodes.

The electrostatic measurement part 21 is configured to allow the electrodes other than the selected detection electrode $EL_n$ to be the first electric potential condition (any one of Lo condition, Hi condition and Open condition) so as to measure the voltages corresponding to the electrostatic capacitances by the above-mentioned measurement program. The measurement is carried out to all the detection electrodes $EL_n$ while sequentially changing n. Next, the electrostatic measurement part 21 allows the electrodes other than the selected detection electrode $EL_n$ to be the second electric potential condition that is different from the first electric potential condition (any one of Lo condition, Hi condition and Open condition) and similarly measures the voltages corresponding to the electrostatic capacitances for all the detection electrodes $EL_n$ while sequentially changing n. A series of measurements as mentioned above are carried out predetermined number of times, and values obtained by applying an A/D conversion to the voltages measured for the respective detection electrodes $EL_n$ are integrated and averaged, thereby the integrated and averaged values can be defined as measurement values $C_n$ based on the voltages of the respective detection electrodes $EL_n$. By being integrated and averaged, measurement error can be reduced and disturbance factor such as noise can be excluded.

The judgment part 22 is configured to compare the measurement values corresponding to the respective voltages of the detection electrode at the time of the first and the second electric potential conditions. In case that the difference between the measurement value $C_{n1}$ based on the voltage of the detection electrode $EL_n$ at the time of the first electric potential condition and the measurement value $C_{n2}$ based on the voltage of the detection electrode $EL_n$ at the time of the second electric potential condition is beyond a predetermined threshold value, it can be judged that the short circuit is present in the electrodes $EL_1$ to $EL_9$ or the connector terminals 41 and the like. Further, the judgment part 22 can be also configured such that, for example, by sealing the connector terminals 41 and the like with a resin or the like, only the short circuit limited to the electrodes $EL_1$ to $EL_9$ is judged.

Operation of Electrostatic Capacitance Detection Device

Figure 2:
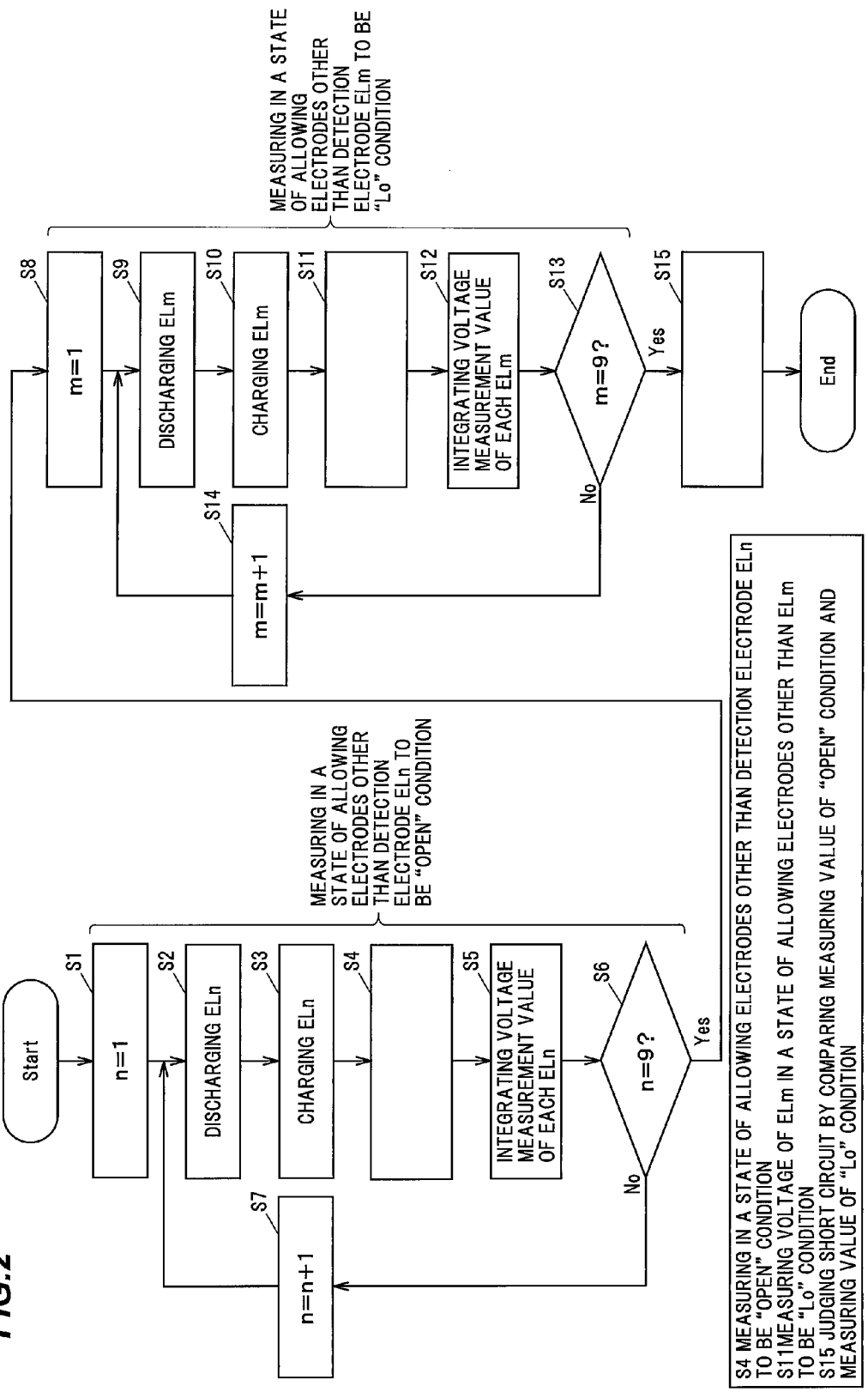
FIG. 2 is a flow chart showing one example of an operation of the electrostatic capacitance detection device according to the embodiment of the invention.

FIG. 2 is a flow chart showing one example of an operation of the electrostatic capacitance detection device according to the embodiment of the invention. Hereinafter, a case that the first electric potential condition is Open condition and the second electric potential condition is Lo condition will be explained.

If the electrostatic capacitance detection device 1 starts to operate, first, the measurement in which the electrodes other than the detection electrode $EL_n$ to $EL_9$ are allowed to be Open condition is carried out predetermined number of times by Step 1 (S1) to Step 7 (S7).

The control part 2 allows the counter value in the counter part to be n=1, and select the detection electrode $EL_1$ from the electrodes $EL_1$ to $EL_9$ (S1).

The control part 2 allows the measurement terminal $TR_1$ to be connected to ground level so as to carry out a discharge of the detection electrode $EL_1$ as a charging preparation to the detection electrode (S2).

The control part 2 carries out a charge to the detection electrode $EL_1$ from the charging part via the measurement terminal $TR_1$ (S3).

The control part 2 allows the electrodes other than the detection electrode $EL_1$ to be Open condition so as to measure the voltage of the detection electrode $EL_1$ (S4).

The control part 2 integrates the voltage measurement values of the detection electrode $EL_1$ so as to obtain the measurement value $C_{11}$ (S5).

The control part 2 judges whether n=9 is satisfied or not. If n=9 is satisfied, it proceeds to Step 8 (S8), and if n=9 is not satisfied, it allows the counter value to be 2 (n=n+1) in Step 7 (S7) so as to return to Step 2 (S2).

The above-mentioned measurement in which the electrodes other than the detection electrode $EL_n$ are allowed to be Open condition is continued such that the integration of the voltage measurement values is carried out with respect to the respective detection electrodes $EL_n$ until n=9 is satisfied so as to obtain the measurement value $C_{n1}$ with respect to the respective detection electrodes $EL_n$.

After the above-mentioned measurement in which the electrodes other than the detection electrode $EL_n$ are allowed to be Open condition is completed, the measurement in which the electrodes other than the detection electrode $EL_m$ are allowed to be Lo condition is carried out predetermined number of times in accordance with Step 9 (S9) to Step 15 (S15).

The control part 2 allows the counter value in the counter part to be m=1, and select the detection electrode $EL_1$ from the electrodes $EL_1$ to $EL_9$ (S8).

The control part 2 allows the measurement terminal $TR_1$ to be connected to ground level so as to carry out a discharge of the detection electrode $EL_1$ as a charging preparation to the detection electrode (S9).

The control part 2 carries out a charge to the detection electrode $EL_1$ from the charging part via the measurement terminal $TR_1$ (S10).

The control part 2 allows the electrodes other than the detection electrode $EL_1$ to be Lo condition so as to measure the voltage of the detection electrode $EL_1$ (S11).

The control part 2 integrates the voltage measurement values of the detection electrode $EL_1$ so as to obtain the measurement value $C_{12}$ (S12).

The control part 2 judges whether m=9 is satisfied or not. If m=9 is satisfied, it proceeds to Step 15 (S15), and if m=9 is not satisfied, it allows the counter value to be 2 (m=m+1) in Step 14 (S14) so as to return to Step 9 (S9).

The above-mentioned measurement in which the electrodes other than the detection electrode $EL_m$ are allowed to be Lo condition is continued such that the integration of the voltage measurement values is carried out with respect to the respective detection electrodes $EL_m$ until m=9 is satisfied so as to obtain the measurement value $C_{m1}$ with respect to the respective detection electrodes $EL_m$.

The control part 2 compares the measurement value $C_{n1}$ obtained by allowing the electrodes other than the detection electrode $EL_n$ to be Open condition with the measurement value $C_{m1}$ obtained by allowing the electrodes other than the detection electrode $EL_m$ to be Lo condition in the judgment part 22 so as to judge the presence or absence of short circuit in the region of the electrode $EL_1$ to $EL_9$. Further, the comparison is carried out with respect to the case that n=m is satisfied, namely with respect to the same electrode, and the presence or absence of short circuit is judged by the difference in the measurement values caused by the difference between Open condition and Lo condition.

Figure 3:
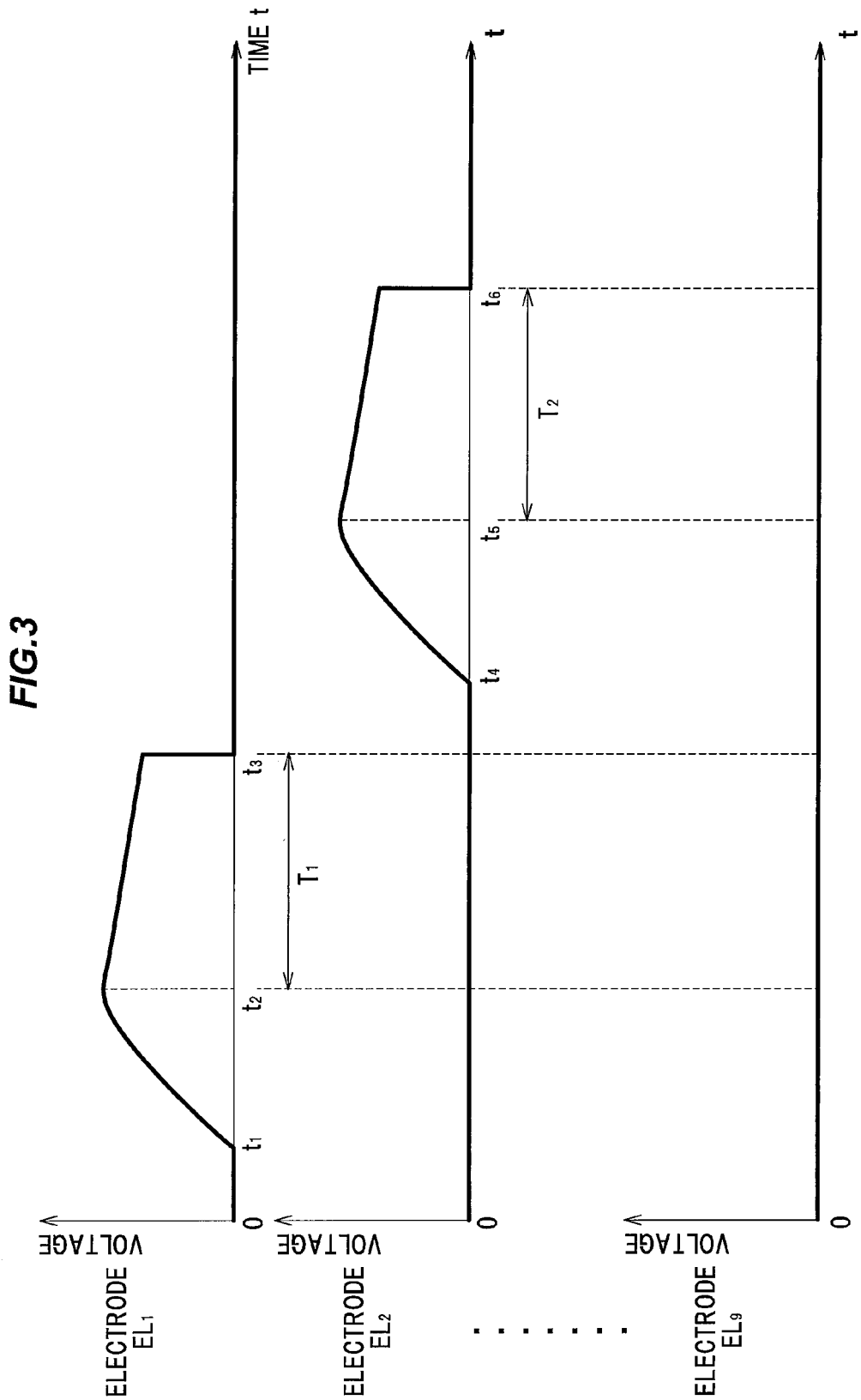
FIG. 3 is a graph showing one example of an operation of the electrostatic capacitance detection device according to the embodiment of the invention, the graph showing voltage changes of the electrodes $EL_1$ to $EL_9$ so as to be vertically juxtaposed.

FIG. 3 is a graph showing one example of an operation of the electrostatic capacitance detection device, the graph showing voltage changes of the electrodes $EL_1$ to $EL_9$ so as to be vertically juxtaposed. In addition, FIG. 4 is a graph showing a difference in the detection voltage between a case that a short circuit is present and a case that the short circuit is absent.

In FIG. 3, with regard to the electrode $EL_1$, a discharge is carried out during the time t0 to t1 (Step 2) and a charge is carried out during the time t1 to t2 (Step 3). During the measurement period T1 of the time t2 to t3, the measurement of voltage, the A/D conversion and the integration are carried out. With regard to the voltage waveform, in accordance with a loop measurement, the same voltage waveform is obtained as shown in the electrodes $EL_1$ to $EL_9$.

As shown in FIG. 4, if the short circuit is present in case that the electrodes other than the detection electrode are measured in Open condition, electrical current flows from the detection electrode to the surrounding electrodes, thus the detection electrode is reduced in the electric potential. In addition, if the short circuit is present in case that the electrodes other than the detection electrode are measured in Lo condition, electrical current flows from the detection electrode to the surrounding electrodes and electrical current flows to ground, thus the detection electrode is reduced in the electric potential more than a case of the measurement in Open condition.

As mentioned above, as the first or the second electric potential condition, Hi condition can be also adopted. In FIG. 4, if the short circuit is present in case that the electrodes other than the detection electrode are measured in Hi condition, electrical current flows into the detection electrode from the surrounding electrodes, thus the detection electrode is increased in the electric potential.

The presence or absence of short circuit in the respective detection electrodes is judged by measuring the above-mentioned change in electric potential as voltages in the respective measurement periods T1 to T9, and comparing the measurement values obtained by A/D-converting and integrating the voltages between the first electric potential condition (any one of Lo condition, Hi condition and Open condition) and the second electric potential condition (any one of Lo condition, Hi condition and Open condition that is different from the first electric potential condition in the condition type).

The above-mentioned series of operation makes it possible to judge the presence of absence of short circuit in the region of the respective electrodes $EL_1$ to $EL_9$. The judgment of the presence of absence of short circuit can be carried out with respect to the respective electrodes $EL_1$ to $EL_9$. Consequently, the occurrence of short circuit between the respective electrodes can be detected. In addition, as mentioned above, the occurrence of short circuit between the respective pins in the connector terminal 41 of the connector 4 can be also detected.

Further, in the above-mentioned flow, the loop measurement in Open condition and the loop measurement in Lo condition are respectively carried out one time, but the loop measurements can be respectively carried out multiple times. In addition, the order of the measurements can be arbitrarily set by changing the selection operation of the selection circuit in the electrostatic measurement part 21.

Effects of the Electrostatic Capacitance Detection Device of the Embodiment

According to the electrostatic capacitance detection device of the embodiment, the following effects can be obtained.

(1) The electrostatic capacitance detection device 1 according to the embodiment is configured to allow the electrodes other than the detection electrode $EL_n$ to be the first electric potential condition (any one of Lo condition, Hi condition and Open condition) so as to measure the voltages corresponding to the electrostatic capacitances, and to integrate and average the values obtained by applying an A/D conversion to the measured voltages so as to define the integrated and averaged values as the measurement values $C_{n1}$. In addition, the electrostatic capacitance detection device 1 is configured to allow the electrodes other than the detection electrode $EL_n$ to be the second electric potential condition (any one of Lo condition, Hi condition and Open condition that is different from the first electric potential condition in the condition type) so as to measure the voltages corresponding to the electrostatic capacitances, and to integrate and average the values obtained by applying an A/D conversion to the measured voltages so as to define the integrated and averaged values as the measurement values $C_{n2}$. The presence or absence of short circuit is judged by comparing two measurement values based on two different electric potential conditions, thus an electrostatic capacitance detection device that is capable of detecting a short circuit without changing usual detection processing of electrostatic capacitance and increasing processing time can be provided.

(2) The values obtained by applying an A/D conversion to the measured voltages are integrated and averaged, and the average values obtained by repeating the above-mentioned operation predetermined number of times are compared with each other, thereby measurement error can be reduced and disturbance factor such as noise can be excluded.

(3) Not only the judgment of short circuit between the electrodes but also the detection of short circuit between the pins of the connector terminals or the like can be carried out. In particular, the electrostatic capacitance detection device according to the embodiment is effective in case of using a connector having a narrow pitch.

Although the invention has been described with respect to the specific embodiments for complete and clear disclosure, the attached claims are not to be thus limited but are to be construed as embodying all modifications and alternative constructions that may occur to one skilled in the art which fairly fall within the basic teaching herein set forth. In particular, it should be noted that all of the combinations of features as described in the embodiment and Examples are not always needed to solve the problem of the invention. Furthermore, the embodiments and modifications thereof can be included within the scope and gist of the invention and within the invention as recited in the attached claims and the equivalents thereof.

What is claimed is:

1. An electrostatic capacitance detection device, comprising:
    a plurality of electrodes formed on a touch panel and configured to detect an electrostatic capacitance;
    an electrostatic capacitance measurement part configured to select one electrode from the plurality of electrodes as a detection electrode, to allow the electrodes other than the detection electrode to be in a first electric potential condition and then to be in a second electric potential condition that is different from the first electric potential condition, and to measure a first voltage of the detection electrode in the first electric potential condition and a second voltage of the detection electrode in the second electric potential condition; and
    a judgment part configured to compare measurement values based on the first and the second voltages of the detection electrode, thereby to judge whether the detection electrode is in a short circuit condition,
    wherein the electrostatic capacitance measurement part is configured to sequentially perform a first loop measurement with respect to all of the plurality of electrodes, the first loop measurement comprising:
    selecting one of the plurality of electrodes as the detection electrode;
    rendering the plurality of electrodes except for the selected detection electrode in the first electric potential condition; and
    measuring the first voltage of the selected detection electrode in the first electric potential condition, and wherein the electrostatic capacitance measurement part is configured to, after the first loop measurement, sequentially perform a second loop measurement with respect to all of the plurality of electrodes, the second loop measurement comprising:
selecting one of the plurality of electrodes as the detection electrode;
rendering the plurality of electrodes except for the selected detection electrode in the second electric potential condition; and
measuring the second voltage of the selected detection electrode in the second electric potential condition.

2. The electrostatic capacitance detection device according to claim 1, wherein the first electric potential condition is one of Open, Lo and Hi, and the second electric potential condition is one of Open condition, Lo condition and Hi condition and is different from the first electric potential condition.

3. The electrostatic capacitance detection device according to claim 1, wherein the electrostatic capacitance measurement part measures more than once the first and second voltages of the detection electrode in the first and the second electric potential conditions.

4. The electrostatic capacitance detection device according to claim 1, wherein the judgment part configured to compare, with respect to all of the plurality of electrodes, a first measurement value based on the first voltage measured at the first loop measurement and a second measurement value based on the second voltage measured at the first loop measurement, thereby to judge whether the selected detection electrode is in the short circuit condition.

5. The electrostatic capacitance detection device according to claim 4, wherein the judgment part judges that the selected detection electrode is in the shot circuit condition when a difference between the first measurement value and the second measurement value is beyond a predetermined threshold value.

* * * * *